(12) United States Patent
Westerman et al.

(10) Patent No.: US 6,846,747 B2
(45) Date of Patent: Jan. 25, 2005

(54) METHOD FOR ETCHING VIAS

(75) Inventors: Russell Westerman, Largo, FL (US); David Johnson, Palm Harbor, FL (US)

(73) Assignee: Unaxis USA Inc., St. Petersburg, FL (US)

( * ) Notice: Subject to any disclaimer, the term of this patent is extended or adjusted under 35 U.S.C. 154(b) by 85 days.

(21) Appl. No.: 10/407,831

(22) Filed: Apr. 4, 2003

(65) Prior Publication Data

US 2003/0216034 A1 Nov. 20, 2003

Related U.S. Application Data

(60) Provisional application No. 60/371,056, filed on Apr. 9, 2002.

(51) Int. Cl.[7] .................. H01L 21/302; H01L 21/461
(52) U.S. Cl. .................. 438/707; 712/714; 712/718; 712/736; 712/935
(58) Field of Search .................. 438/620, 637, 438/667, 700, 707–712, 714, 716, 718, 735–736, 935

(56) References Cited

U.S. PATENT DOCUMENTS

| | | |
|---|---|---|
| 5,169,487 A | 12/1992 | Langley et al. |
| 5,441,596 A | 8/1995 | Nulty |
| 5,456,796 A | 10/1995 | Gupta et al. |
| 5,624,529 A | 4/1997 | Shul et al. |
| 5,637,189 A * | 6/1997 | Peeters et al. ............... 438/466 |
| 5,785,877 A | 7/1998 | Sato et al. |
| 5,849,639 A | 12/1998 | Molloy et al. |
| 5,902,494 A | 5/1999 | Gupta et al. |
| 5,948,703 A | 9/1999 | Shen et al. |
| 5,968,845 A * | 10/1999 | Chino et al. ................. 438/704 |
| 6,008,130 A | 12/1999 | Henderson et al. |
| 6,057,244 A | 5/2000 | Hausmann et al. |
| 6,139,679 A | 10/2000 | Satitpunwaycha |
| 6,178,919 B1 | 1/2001 | Li et al. |
| 6,191,021 B1 | 2/2001 | Fuller et al. |
| 6,214,720 B1 | 4/2001 | Sill et al. |
| 6,254,746 B1 | 7/2001 | Subramani et al. |
| 6,255,221 B1 | 7/2001 | Hudson et al. |
| 6,258,723 B1 | 7/2001 | Takeichi |
| 6,287,974 B1 * | 9/2001 | Miller ......................... 438/706 |
| 6,303,512 B1 | 10/2001 | Laermer et al. |
| 6,326,307 B1 | 12/2001 | Lindley et al. |

(List continued on next page.)

Primary Examiner—Lynne A. Gurley
(74) Attorney, Agent, or Firm—Holland & Knight LLP

(57) ABSTRACT

An improved method for etching a substrate that reduces the formation of pillars is provided by the present invention. In accordance with the method, the residence time of an etch gas utilized in the process is decreased and the power of an inductively coupled plasma source used to dissociate the etch gas is increased. A low bias RF voltage is provided during the etching process. The RF bias voltage is ramped between different bias levels utilized during the etch process. An inductively coupled plasma confinement ring is utilized to force the reactive species generated in the inductively coupled plasma source over the surface of the substrate. These steps reduce or eliminate the formation of pillars during the etching process.

23 Claims, 7 Drawing Sheets

U.S. PATENT DOCUMENTS

| | | |
|---|---|---|
| 6,391,787 B1 | 5/2002 | Dhindsa |
| 6,399,515 B1 | 6/2002 | Tao et al. |
| 6,415,198 B1 | 7/2002 | Nallan et al. |
| 6,433,484 B1 | 8/2002 | Hao et al. |
| 6,451,157 B1 | 9/2002 | Hubacek |
| 6,462,419 B1 * | 10/2002 | Asai ............ 257/774 |
| 6,475,889 B1 | 11/2002 | Ring |
| 6,492,277 B1 | 12/2002 | Ono et al. |
| 2001/0036744 A1 * | 11/2001 | Taravade et al. ...... 438/729 |
| 2001/0044212 A1 | 11/2001 | Nguyen et al. |
| 2002/0055265 A1 | 5/2002 | Ring |
| 2002/0088542 A1 | 7/2002 | Nishikawa et al. |
| 2002/0098708 A1 | 7/2002 | Kumihashi et al. |
| 2002/0123229 A1 | 9/2002 | Ono et al. |
| 2002/0137351 A1 | 9/2002 | Chiou et al. |
| 2002/0179913 A1 * | 12/2002 | Shirakawa .......... 257/79 |
| 2002/0180055 A1 * | 12/2002 | Takahashi et al. ...... 257/774 |
| 2003/0003724 A1 * | 1/2003 | Uchiyama et al. ...... 438/667 |

* cited by examiner

Cl₂ Efficiency vs. Residence Time

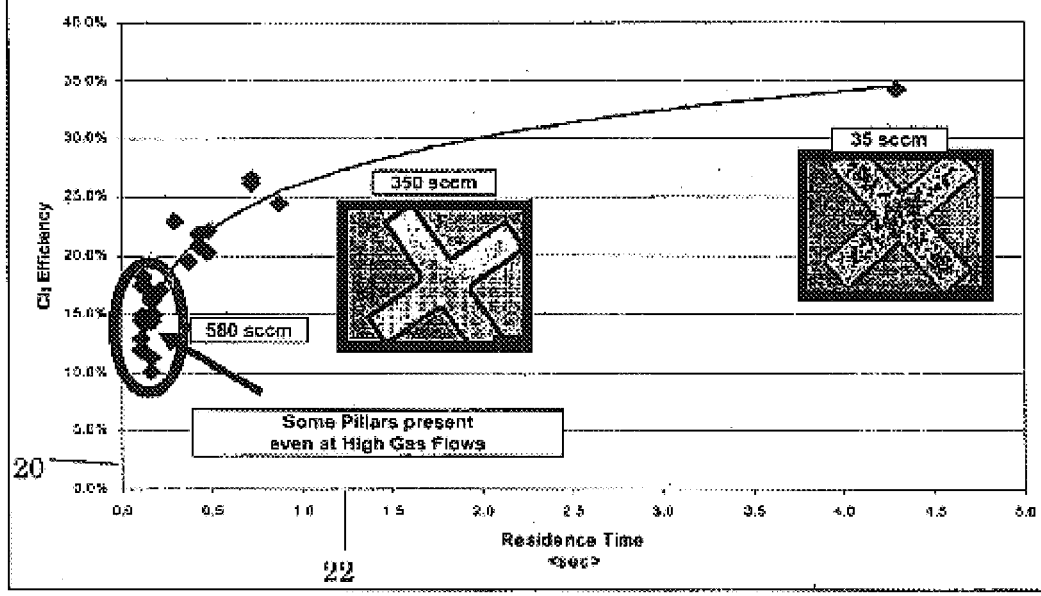
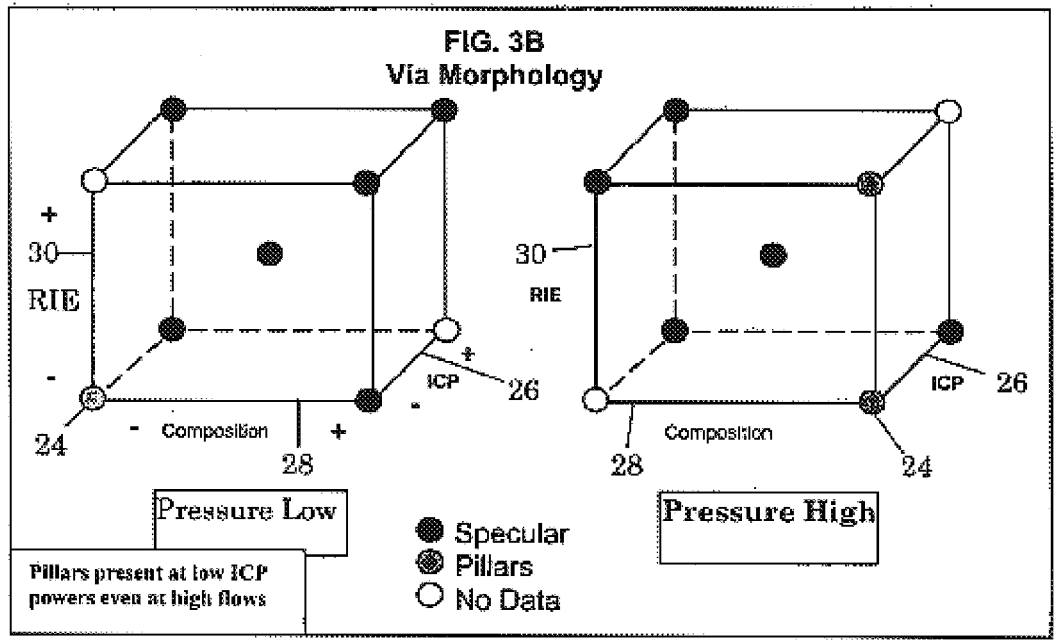

7" Aperture        8" Aperture        No Confinement

METHOD FOR ETCHING VIAS

CROSS REFERENCES TO RELATED APPLICATIONS

This application claims priority from and is related to commonly owned U.S. Provisional Patent Application Ser. No. 60/371,056, filed Apr. 9, 2002, entitled: Improved Method for Etching Vias, this Provisional Patent Application incorporated by reference herein.

BACKGROUND OF THE INVENTION

1. Field of the Invention

The present invention generally relates to the plasma processing of a substrate. More particularly, the present invention relates to an improved method for etching vias in the backside of a gallium arsenide substrate within a plasma processing chamber.

2. Description of the Background Art

GaAs devices are used extensively in the wireless telecommunications industry, where the high electron mobility of GaAs makes it well suited for high frequency, low noise, high gain applications. Although it has excellent electrical properties, GaAs is a relatively poor thermal conductor, making it difficult to remove heat efficiently from power devices. A commonly used solution to this issue is the formation of vias from the wafer backside to the frontside circuitry. Such vias provide a good thermal path for heat removal as well as a low impedance ground connection for RF (radio frequency) devices.

After completion of the frontside processing, the wafer is mounted face down on a carrier wafer and mechanically thinned to a thickness of approximately 100 microns. The back of the wafer is then patterned using photo-resist and the vias are plasma etched through the thinned substrate, stopping on the frontside metal. After resist removal the vias are metallized, typically by sputtering a gold seed layer followed by a gold plating step, to act as the heat sink/ground connection.

Ideally the backside etch process results in a via that has smooth sloped walls. However, in practice, pillar (also known as grass) formation often occurs in a number of vias. FIG. 1 shows typical pillar formations 2. These pillar formations 2 are potentially harmful to reliable metallization of the via 4 etch in the substrate 6. Pillar formations potentially arise from a number of sources. For example, contamination on the etched surface such as residuals from the thinning process or impurities in the substrate either prior to, or exposed during, the etch may act as a micromask. In addition, this micromask effect can also result from introduction of $H_2O$ during sample loading, sputtering and redeposition of nonvolatile mask materials, sputtering and redeposition from reactor components, and formation of low volatility etch products ($GaCl_2$ vs. $GaCl_3$).

Nam et al. addressed pillar formations in a recent journal article. This group concluded that pillar formation depends on the surface condition of the wafer after the grinding process. In addition, the group discovered that pillars form more easily when the physical conditions set forth below are satisfied.

| | |
|---|---|
| Lower bias powers | <100 W |
| Lower ICP powers | <700 W |
| Higher pressure | >13 mtorr |
| Lower $BCl_3$ compositions | <66% BCl3 |

Based upon their observations, the Nam et al. group recommended the following process conditions.

| | |
|---|---|
| $BCl_3$ | 40 sccm |
| $Cl_2$ | 20 sccm |
| Pressure | 8 mtorr |
| RF Bias Power | 50 W |
| ICP Power | 700 W |

In addition, the Nam et al. group recommended an Ar sputter pre-etch to physically remove any residuals from the grind process. Nevertheless, experimentation by the present inventors has shown that pillar formations may occur even when there is compliance with the suggested process conditions. Additionally, the process conditions suggested by Nam et al. result in a relatively low etch rate for the GaAs (<3 micron/minute) which results in a process time of >30 minutes for a typical 100 micron deep via. This problem is expected to be more severe for 150 mm substrates, compared to the 3 inch substrates used by Nam et al.

In view of the above discussed problems with the prior art, what is needed is a high rate, GaAs via etch process that results in sloped via profiles and eliminates pillar formation. Furthermore, the operating parameters for the process should be specified such that the process can be implemented as a production worthy process.

SUMMARY OF THE INVENTION

A preferred embodiment of the present invention is directed toward an improved method for forming via holes in a substrate during an ion assisted etching process. The method commences with the forming of a mask layer on the substrate. The substrate is then placed in an inductively coupled plasma processing system that has an inductively coupled plasma confinement ring. High $Cl_2$ flows are introduced into the processing system and a plasma is ignited using a low RF bias etch. The power level of the inductively coupled plasma processing system is increased to more fully dissociate the high $Cl_2$ flows. The RF plasma is ramped in steps to etch at a high rate and to eliminate pillar formation during the etch process. The ramping of the RF plasma may be accomplished by placing an RC circuit in-line with an analog RF bias setpoint. Alternatively, the ramping of the RF plasma may be incorporated into the operational software used to control the etching process. When the etching process is complete, the substrate is removed from the plasma processing system and the mask layer is stripped from the substrate. The mask may be eroded to produce a via having a sloped profile.

The above described embodiment of the present invention provides a number of benefits over the prior art. For example, the provision of a confinement ring forces the reactive species generated over the surface of the substrate. This insures that enough of the reactive species is present at the surface of the substrate to give a high etch rate and to prevent the formation of pillars. In addition, the increased flow rate of the reactive gas and the increased power level of the inductively coupled plasma, which insures that the gas is more fully dissociated, provides for an excess of etch gas at the surface of the substrate. As a result, the present invention substantially decreases the formation of pillars during an etch process.

Another embodiment of the present invention is directed toward an improved method for forming via holes in a GaAs substrate using an inductively coupled plasma source. The method is centered around decreasing a residence time of an etch gas used during an etching process to prevent the formation of pillars and increasing the power of the inductively coupled plasma source to more fully dissociate the etch gas into reactive species. The etching process is initiated with a low RF bias voltage. The RF bias voltage is ramped between different RF bias voltage levels used during different steps in the etching process. The residence time of a gas is the average time a gas molecule remains in the reactor before being pumped away. Residence time can be calculated by the following formula:

$$t=pV/Q$$

Where t is the residence time in seconds, p is the pressure in torr, V is the chamber volume in liters, and Q is the gas flow rate measured in torr·liters/second. For a reactor with a fixed volume, the residence time can be decreased by decreasing the process pressure or increasing the gas flow rate. The residence time of the etch gas is decreased (preferably to less than 1 second) by introducing high $Cl_2$ flows at lower pressures during the etching process to provide an excess of reactive Cl. An aperture is placed between the inductively coupled plasma source and the substrate surface to force reactive Cl generated in the inductively coupled plasma source over the surface of the substrate.

As discussed above, decreasing the residence time of the etch gas and increasing the power of the inductively coupled plasma source substantially limits pillar formation. In addition, ramping, rather than stepping, the RF bias voltage between different levels also eliminates pillar formation due to voltage spikes caused by rapid changes in the bias voltage. Therefore, the present invention represents a substantial improvement upon the prior art.

BRIEF DESCRIPTION OF THE DRAWINGS

FIGS. 3(*a*) and 3(*b*) graphically illustrate pillar density vs. ICP powers for a given set of operating parameters;

DETAILED DESCRIPTION OF THE INVENTION

Figure 1:
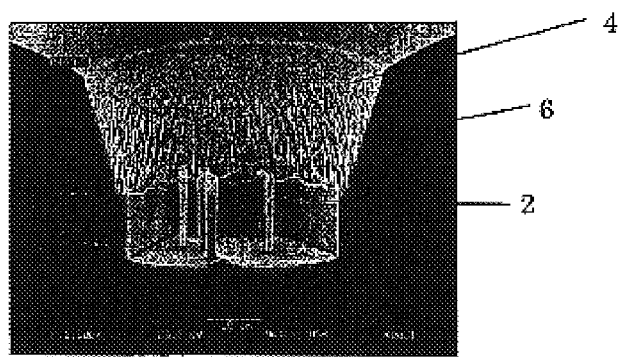
FIG. 1 is a pictorial representation of pillar formations in an etched via.

A preferred embodiment of the present invention is directed toward a method of etching GaAs vias utilizing at least one of high $Cl_2$ flows (short residence times), high inductively coupled plasma (ICP) powers, an ICP confinement ring, low RF bias etch initiation and RF ramping. As discussed in more detail below, these process modifications result in a high rate (>6.0 μm/min) via etch process that eliminates pillars. In addition, a sloped via profile is achievable through the erosion of a sloped photoresist mask.

Dry etching of GaAs vias requires etching relatively deep (~100 um) features into a thinned GaAs substrate ending on a metal etch stop (typically gold). The dry etch process is typically chlorine based (i.e., $BCl_3/Cl_2$, $Ar/Cl_2$, $SiCl_4/Cl_2$, etc.) due to the relatively high volatility of the etch products as shown in Table 1. While fluorine plasmas will not chemically etch GaAs, small amounts of fluorine containing precursors ($CF_4$, etc.) may also be added to the process to assist in profile control.

TABLE 1

| Component | Etch Product | Normal Boiling Point (° C.) |
|---|---|---|
| Ga | $GaCl_2$ | 535 |
|  | $GaCl_3$ | 201 |
| As | $AsCl_3$ | 130 |

Anisotropic GaAs etching in chlorine based chemistries follows an ion assisted chemical etch mechanism. In a purely chemical etch process, the reaction etch products have sufficiently volatility to spontaneously desorb from the surface. In an ion assisted process, desorption of the etch products is assisted by ion bombardment. Ion assisted chemical etch processes may involve the formation and removal of nonvolatile etch products which may roughen the surface morphology as the etch proceeds.

While a $Cl_2$ plasma will readily etch GaAs, a $Cl_2$ only plasma often has trouble etching any native oxides, resulting in a roughened surface. Oxygen scavengers (such as $BCl_3$ or $SiCl_4$) are often added to the process gas mixture to remove any native oxides.

A proposed mechanism responsible for etching GaAs in a Cl-based plasma preferably consists of a number of steps as set forth below.

Ionization

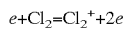
$$e+Cl_2=Cl_2^++2e$$

Etchant Formation

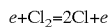
$$e+Cl_2=2Cl+e$$

Adsorption of etchant on substrate

$$Cl=GaAs_{surf}\text{-}nCl$$

Formation of the etch product

$$GaAs\text{-}nCl=GaCl_{x(ads)}+AsCl_{y(ads)}$$

Product Desorption by evaporation

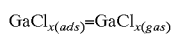
$$GaCl_{x(ads)}=GaCl_{x(gas)}$$

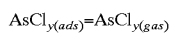
$$AsCl_{y(ads)}=AsCl_{y(gas)}$$

Product Desorption by Ion-Assisted Desorption

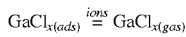

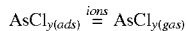

One possible mechanism for pillar formation during GaAs etching is through the creation of sub-chlorides (GaCl$_2$, GaCl, AsCl$_2$ or AsCl). Lower volatility sub-chlorides (i.e., GaCl$_2$-b.p. 535° C.), once formed, may act as an etch mask initiating pillar formation. Sub-chloride formation is favored in a chlorine deficient process regime. Thus sub-chloride formation, and hence pillar formation, will be reduced in a Cl-excess environment. In order to supply an excess of reactive Cl at the wafer surface, a variety of process changes may be implemented as discussed in more detail below.

Figure 2:
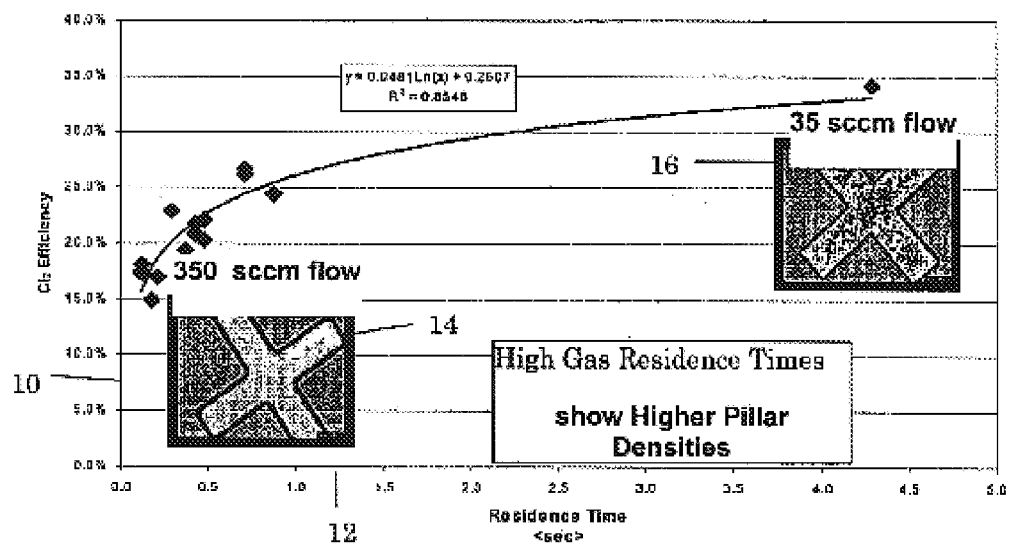
FIG. 2 shows $Cl_2$ usage efficiency vs. gas residence time for a GaAs via etch process.

For a given reactor volume and process pressure, increasing the total process gas flow decreases the gas residence time. Decreasing the residence time reduces the efficient use of chlorine and results in an excess of reactive chlorine at the wafer surface. FIG. 2 shows Cl$_2$ usage efficiency 10 vs. process gas residence time 12 for the GaAs via etch process. As can be seen in FIG. 2, shorter gas residence times 12 result in lower Cl$_2$ efficiency 10 and reduced pillar densities as shown in inserts 14 and 16. Therefore, a preferred embodiment of the present invention utilizes reduced gas residence times to minimize pillar formation.

Introducing higher process gas flows into the reactor decreases residence times, but may not result in the higher concentrations of reactive Cl species required for minimizing pillar formation during GaAs etching in all situations. Therefore, in conjunction with higher Cl$_2$ flows 28, relatively higher ICP powers 26 are preferably utilized to effectively dissociate the relatively higher amounts of Cl$_2$ into reactive Cl species. This is confirmed in experiments that show that even at higher Cl$_2$ flows 28 (low residence times) pillar formation 24 can still occur without increased ICP power 26. For example, FIGS. 3(a) and 3(b) show that pillar 24 density increases at lower ICP powers 26, even at flows 28 in excess of 500 seem. Therefore, increased ICP power 26 is utilized in conjunction with the preferred embodiments of the present invention to fully dissociate the etch gas and prevent the formation of pillars.

Figure 4:
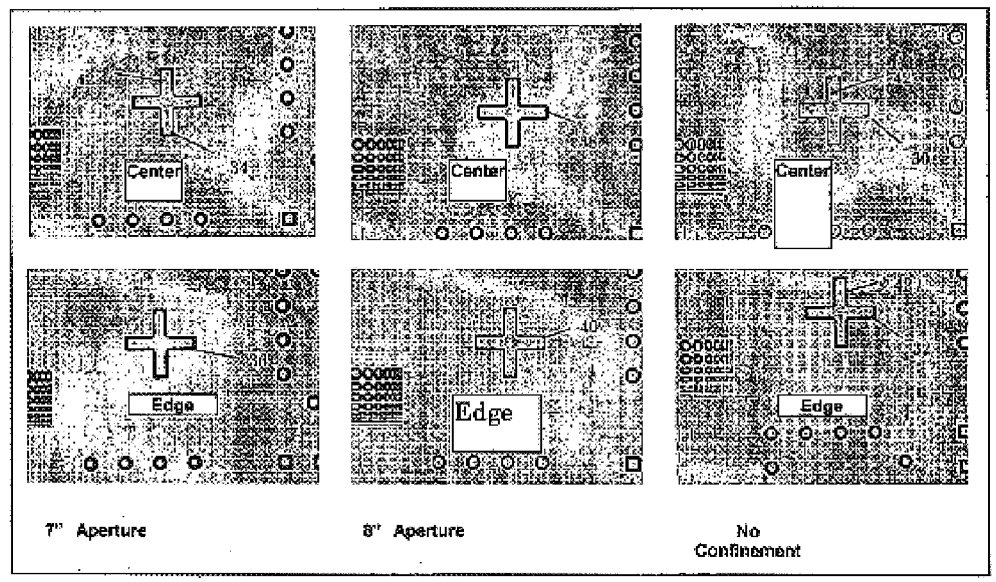
FIG. 4 depicts differences in pillar density for different sizes of confinement rings.

Placing an aperture between the ICP and the wafer surface to force the reactive species generated in the ICP over the surface of the wafer also decreases pillar densities. This is shown in FIG. 4 which demonstrates the difference in pillar 42 density on features 30 and 32 constructed in a process with no confinement ring versus processes utilizing a seven inch aperture to produce features 34 and 36 and an eight inch aperture to produce features 38 and 40. The most pillars 42 are formed in a feature 30 constructed on a substrate having no aperture. Conversely, the fewest pillars are formed in a feature 40 constructed on a substrate when an eight inch aperture was used. Thus, as shown in FIG. 4, a confinement ring can be utilized to further reduce the formation of pillars 42.

In addition to the use of higher process gas flows and higher ICP powers as discussed above, the present inventors discovered that using a low RF bias voltage during etch initiation also reduces pillar densities during GaAs via etching. Prior to entering the GaAs via etch process, the substrates are mounted to a rigid carrier (typically sapphire) and thinned to ~100 microns. During the course of the thinning operation, the surface of the GaAs is degraded (e.g., embedded abrasive materials, damage in the crystal structure, etc.). One approach to overcoming contamination on etched surfaces is to initiate the etch using a physical etch that will be able to remove both volatile and non volatile etch products. Nam et. al. recommend an Ar sputter etch for this purpose.

Figure 5:
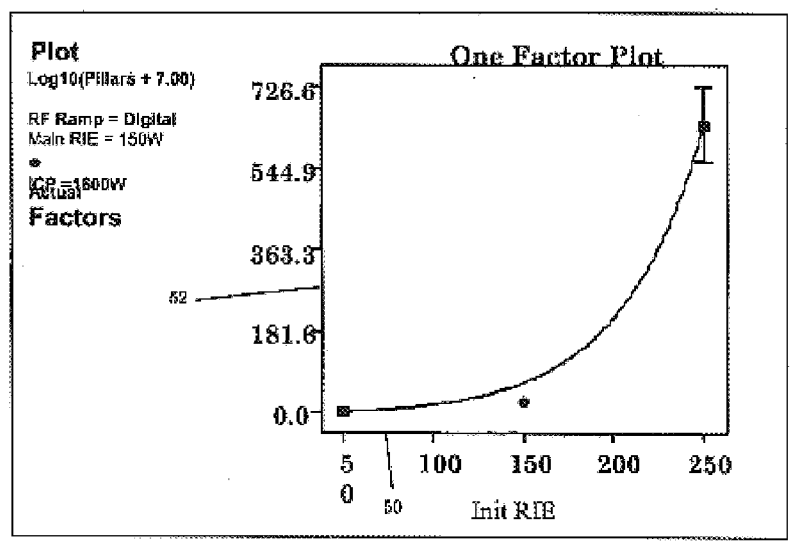
FIG. 5 shows pillar formation as a function of the reactive ion etching (RIE) power.

Through designed experiments, we have discovered that a more chemically driven etch initiation (high Cl$_2$ flows, high ICP powers, low RF bias) results in lower pillar densities. This is shown in FIG. 5 which is a plot of the number of pillars 50 created for different levels of initial reactive ion etching power 52. As the initial bias power 52 increases, the amount of pillar formation 50 also increases. Thus, preferred embodiments of the method of the present invention utilize a low initial reactive ion etching bias level.

A typical GaAs via etch process consists of multiple steps (i.e., Etch initiation, Main Etch, Over etch, etc.). These different steps often require different RF bias powers. During the transition between two process steps with different RF bias powers, there is often a momentary decrease in RF bias power, due to the time needed for the matching network to respond. This RF bias decrease is accompanied by a corresponding "spike" in RF bias reflected power. Experiments have shown that pillar densities can increase due to these RF bias decreases. RF bias changes between process steps are usually step functions (digital changes). Thus, these RF bias decreases (and the associated reflected power spikes) can be eliminated by ramping the RF bias between steps, allowing time for the matching network to follow the change. Alternatively the response time of the RF impedance matching can be improved through the use of a variable RF frequency (i.e. frequency matching) instead of a mechanical RF impedance matching network.

Figure 6:
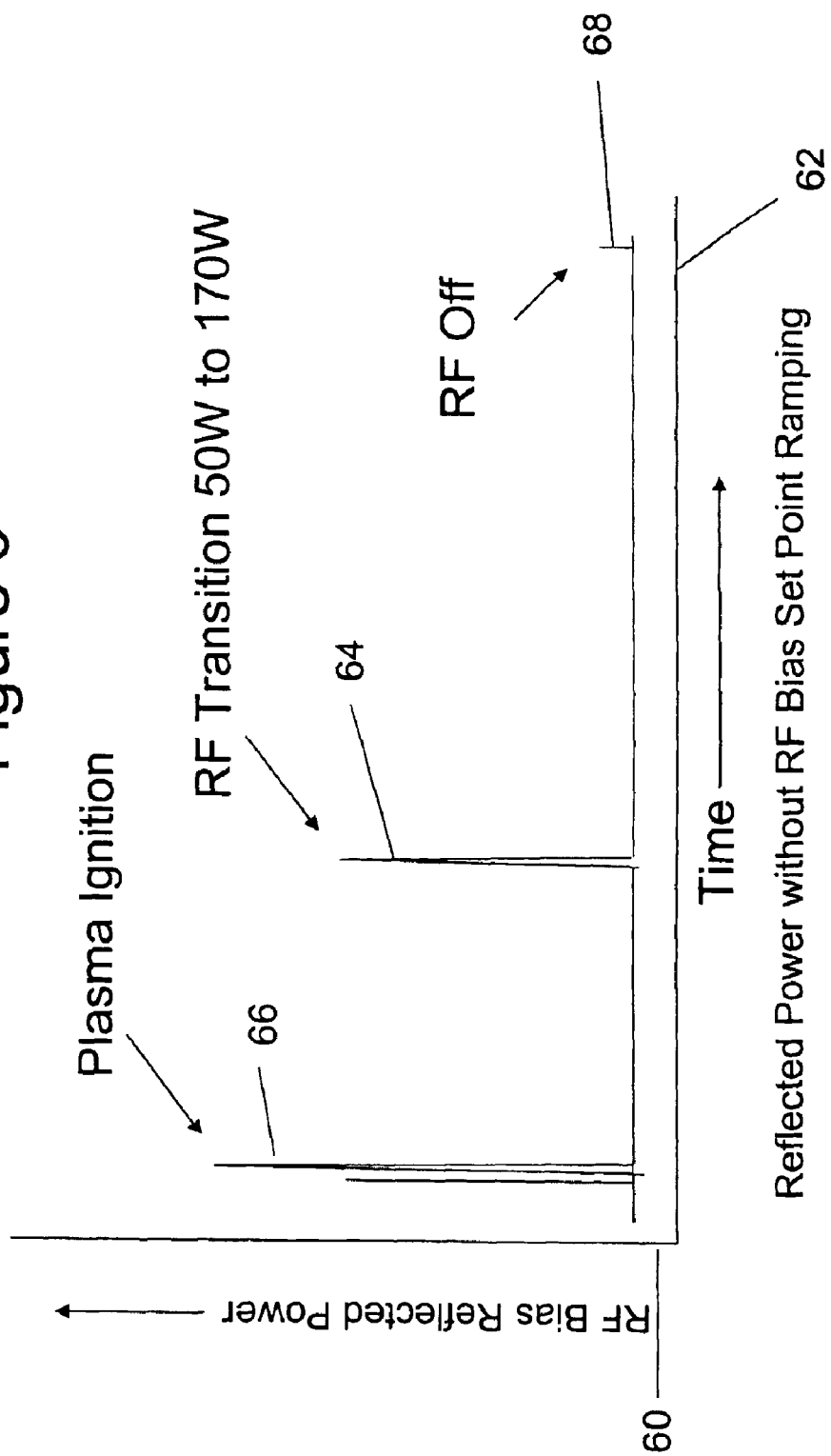
FIG. 6 shows RF bias reflected power vs. time for a process using a digital RF bias power change (50 W–170 W)
Figure 7:
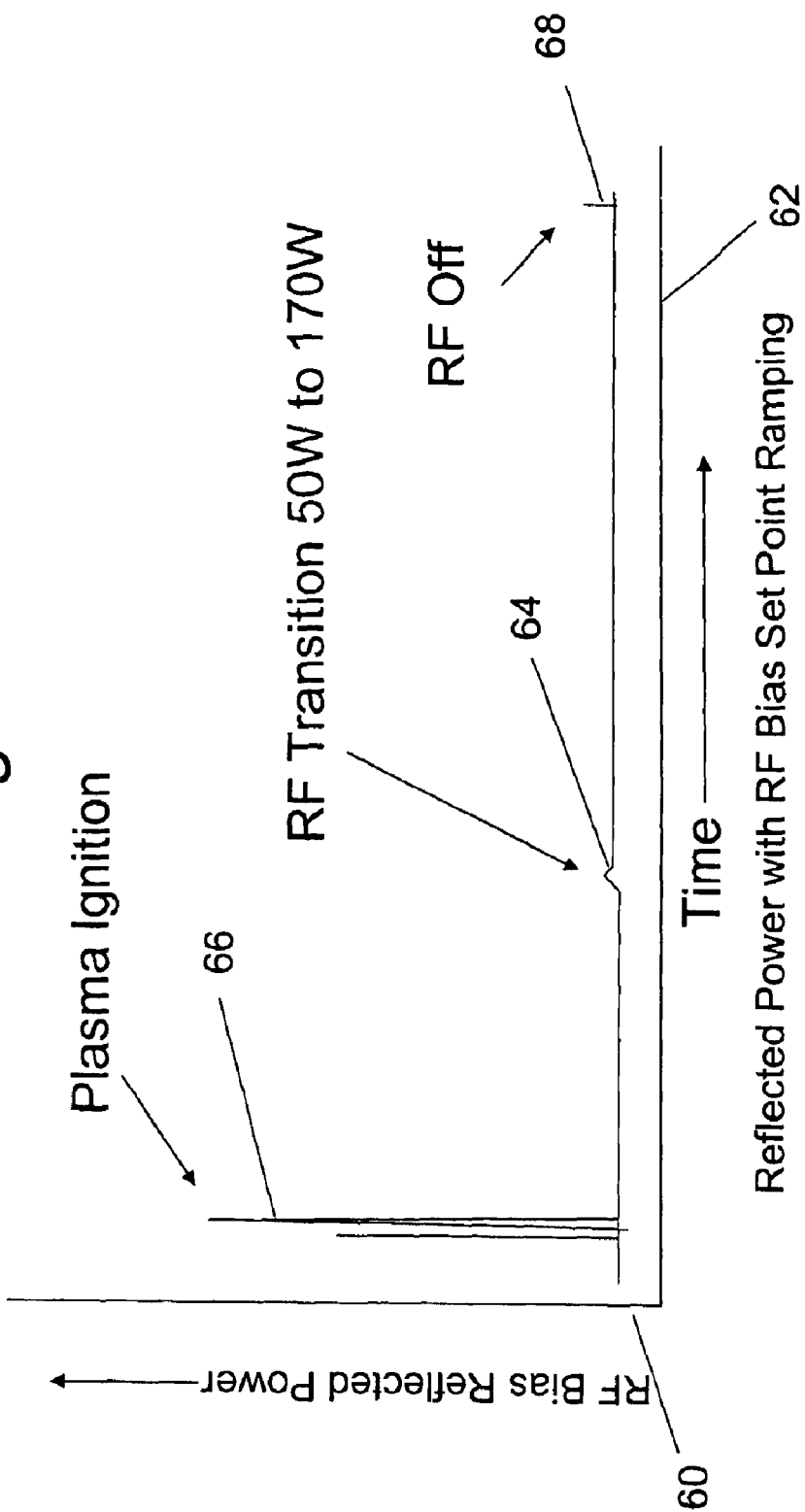
FIG. 7 shows RF bias reflected power vs. time for a process using a ramped RF Bias power change (50 W–170 W with a 2 second RC time constant applied to a digital RF bias power change)

The above discussed reflected power spikes are illustrated in FIGS. 6 and 7. These figures show the RF bias reflected power 60 vs. time 62 for identical processes. In FIG. 6, a first process uses a digital RF bias power change (50 W–170 W) and exhibits a momentary spike 64 in RF bias reflected power when the RF bias power changes from 50 W to 170 W. This is in addition to smaller spikes 66 and 68 that occur when the plasma is ignited 66 and when the plasma is terminated 68. However, it is the spike 64 during the transition in power that primarily produces the undesirable pillars.

The step change in the setpoint illustrated in FIG. 6 can be ramped by placing an RC circuit in-line with the analog RF bias setpoint. As shown in FIG. 7, this second process uses ramped RF bias power change (50 W–170 W with a 2 second time constant) and shows a much smaller spike 64 in RF bias reflected power. Alternatively, instead of using an RC circuit in the analog set point line, setpoint ramping can be implemented within the operating software. Either way the concept involves minimizing the formation of pillars by eliminating rapid changes in the RF bias voltage.

Figure 8:
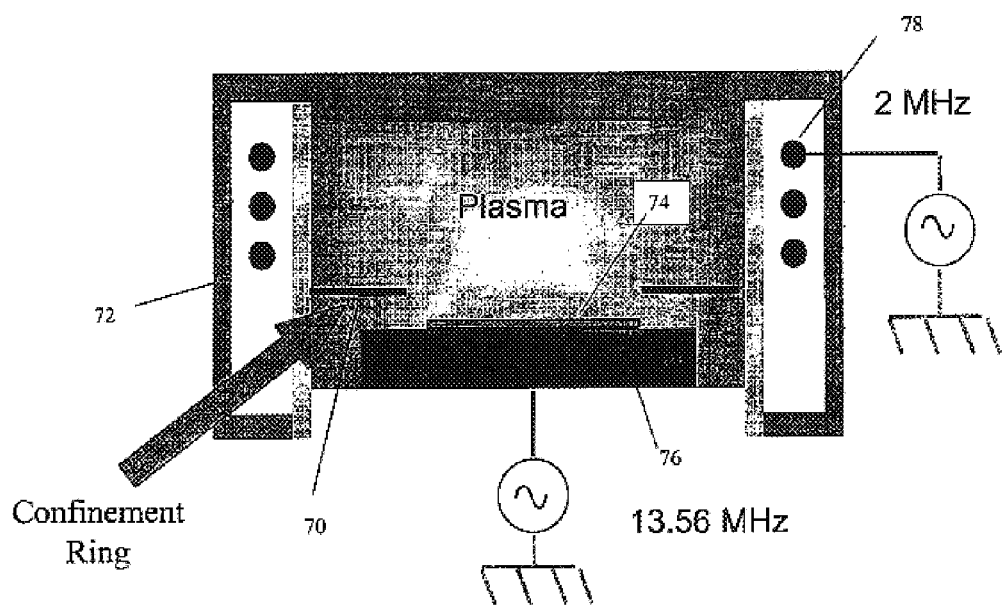
FIG. 8 depicts a confinement ring within the plasma processing chamber.

FIG. 8 depicts a confinement ring 70 within the plasma processing chamber 72. The confinement ring 70 is positioned above the substrate 74. In this embodiment, the substrate 74 is shown positioned on an electrode 76 within an ICP source 78.

Figure 9:
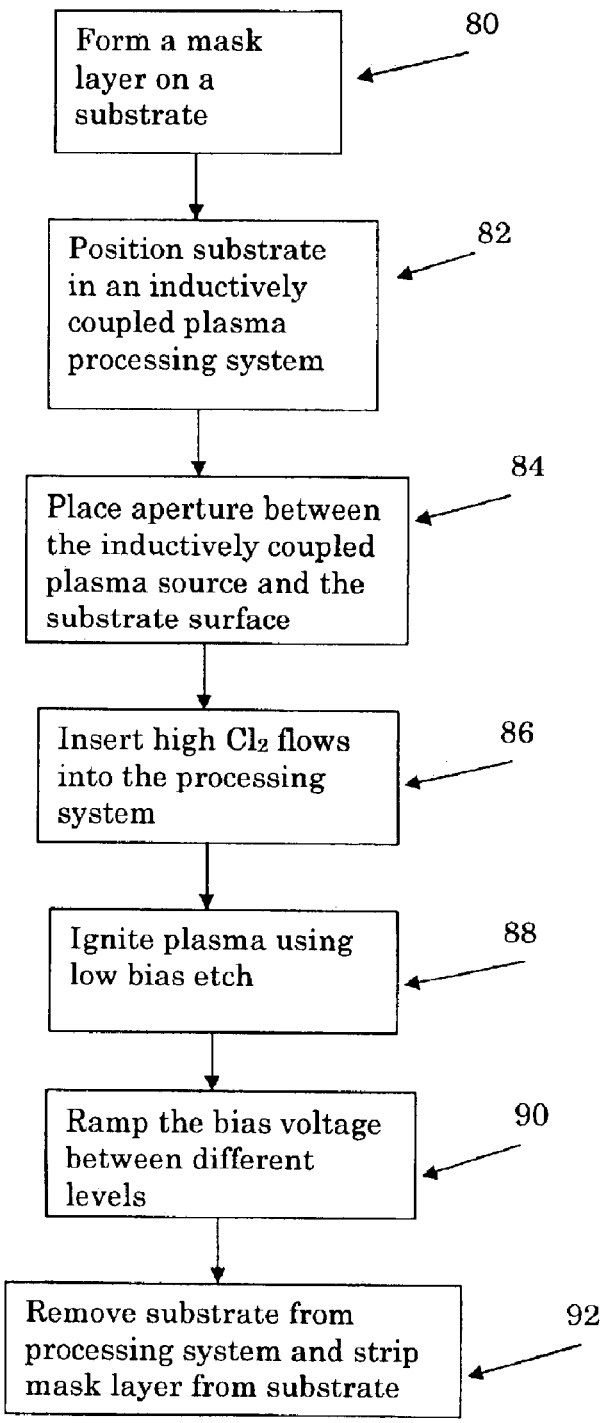
FIG. 9 shows a preferred method of etching a substrate without inducing pillar formation in accordance with an embodiment of the present invention.

FIG. 9 is an example of a preferred embodiment of the present invention. The method commences in block 80 with the forming of a mask layer on a substrate. The substrate is then positioned in an inductively coupled plasma processing system as set forth in block 82. In block 84, an aperture is placed between the inductively coupled plasma source in the processing system and the surface of the substrate. As previously discussed, placing an aperture between the plasma source and the surface of the substrate forces the reactive species generated in the ICP chamber over the surface of the wafer and thereby inhibits pillar formation on the substrate. In addition, in block 86, high Cl$_2$ flows are introduced into the processing system. This high Cl$_2$ flow increases the amount of reactive agents in the processing chamber and further decreases the formation of pillars. In block 88, the plasma is ignited using a low bias etch voltage. This bias voltage is ramped between different levels to prevent voltage spikes that may occur during transitions as set forth in block 90. In block 92 the GaAs is etched to the required depth using high ICP power. Finally, in block 94, the substrate is removed from the processing system and the mask layer is stripped from the substrate to reveal the pillar free etched structure.

Using the above preferred method, a 150 mm GaAs wafer, patterned with an array of 40 micron diameter vias as part of a pattern comprising 15% of the wafer surface, was etched using the process conditions detailed below.

| Step 1 (Etch Initiation) | |
|---|---|
| BCl$_3$ | 25 sccm |
| Cl$_2$ | 500 sccm |
| Pressure | 12 mTorr |
| ICP Power | 1800 Watts |
| RF Bias | 70 Watts |
| Step 2 (Etch to final depth) | |
| BCl$_3$ | 25 sccm |
| Cl$_2$ | 500 sccm |
| Pressure | 12 mTorr |
| ICP Power | 1200 Watts |
| RF Bias | 170 Watts |

The wafer etched at an etch rate of 9 micron/minute with a selectivity ratio to photo-resist of >13:1 and had substantially no pillars over the entire wafer surface.

It will be understood that the specific embodiments of the invention shown and described herein are exemplary only. Numerous variations, changes, substitutions and equivalents will now occur to those skilled in the art without departing from the spirit and scope of the present invention. Accordingly, it is intended that all subject matter described herein and shown in the accompanying drawings be regarded as illustrative only and not in a limiting sense and that the scope of the invention be solely determined by the appended claims.

We claim:

1. An improved method for forming via holes in a GaAs substrate comprising the steps of:
    forming a mask layer on the GaAs substrate;
    placing said GaAs substrate in an inductively coupled plasma processing system;
    introducing high Cl$_2$ flows into the processing system;
    etching via holes in the GaAs substrate by increasing a power level of the inductively coupled plasma processing system to more fully dissociate the high Cl$_2$ flows;
    removing the GaAs substrate from the plasma processing system; and
    stripping said mask layer from said GaAs substrate.

2. The method of claim 1 wherein said processing system having an inductively coupled plasma confinement ring.

3. The method of claim 1 further comprising the step of initiating the etch using a low RF bias power.

4. The method of claim 1 further comprising the step of decreasing a residence time of an etch gas used during an etching process to prevent the formation of pillars.

5. The method of claim 1 comprising the step of ramping the RF power between different levels between process steps to eliminate pillar formation during the etch process.

6. The method of claim 1 wherein the etch process further comprises an ion assisted etch process.

7. An improved method for forming via holes in a GaAs substrate using an inductively coupled plasma source, the method comprising the steps of:
    forming a mask layer on the GaAs substrate;
    placing said GaAs substrate in an inductively coupled plasma processing system;
    introducing high Cl$_2$ flows into the processing system;
    etching via holes in the GaAs substrate by initiating the etch using a low RF bias power;
    increasing a power level between about 1.5 kW to 4 kW of the inductively coupled plasma processing system to more fully dissociate the high Cl$_2$ flows;
    removing the GaAs substrate from the plasma processing system; and
    stripping said mask layer from the GaAs substrate.

8. The method of claim 7 wherein said processing system having an inductively coupled plasma confinement ring.

9. The method of claim 7 further comprising the step of decreasing a residence time of an etch gas used during an etching process to prevent the formation of pillars.

10. The method of claim 7 comprising the step of ramping the RF power between different levels between process steps to eliminate pillar formation during the etch process.

11. The method of claim 7 wherein the etch process further comprises an ion assisted etch process.

12. An improved method for forming via holes in a GaAs substrate comprising the steps of:
    forming a mask layer on the GaAs substrate;
    placing said GaAs substrate in an inductively coupled plasma processing system;
    decreasing a residence time of an etch gas used during an etching process to prevent the formation of pillars;
    etching via holes in the GaAs substrate by increasing a power level of the inductively coupled plasma processing system to more fully dissociate the etch gas;
    removing the GaAs substrate from the plasma processing system; and stripping said mask layer from said GaAs substrate.

13. The method of claim 12 wherein said processing system having an inductively coupled plasma confinement ring.

14. The method of claim 12 further comprising the step of introducing high Cl$_2$ flows into the processing system.

15. The method of claim 12 further comprising the step of initiating the etch using a low RF bias power.

16. The method of claim 12 comprising the step of ramping the RF power between different levels between process steps to eliminate pillar formation during the etch process.

17. The method of claim 12 wherein the etch process further comprises an ion assisted etch process.

18. An improved method for forming via holes in a GaAs substrate comprising the steps of:
    forming a mask layer on the GaAs substrate;
    placing said GaAs substrate in an inductively coupled plasma processing system;
    initiating the etch using a low RF bias power;

etching via holes in the GaAs substrate by ramping the RF power between different levels between process steps to eliminate pillar formation during the etch process;

removing the GaAs substrate from the plasma processing system; and stripping said mask layer from said GaAs substrate.

19. The method of claim 18 wherein said processing system having an inductively coupled plasma confinement ring.

20. The method of claim 18 further comprising the step of introducing high $Cl_2$ flows into the processing system.

21. The method of claim 20 further comprising the step of increasing a power level of the inductively coupled plasma processing system to more fully dissociate the high $Cl_2$ flows.

22. The method of claim 18 further comprising the step of decreasing a residence time of an etch gas used during an etching process to prevent the formation of pillars.

23. The method of claim 18 wherein the etch process further comprises an ion assisted etch process.

* * * * *

UNITED STATES PATENT AND TRADEMARK OFFICE
CERTIFICATE OF CORRECTION

PATENT NO. : 6,846,747 B2
APPLICATION NO. : 10/407831
DATED : January 25, 2005
INVENTOR(S) : Russell Westerman and David Johnson It is certified that error appears in the above-identified patent and that said Letters Patent is hereby corrected as shown below:

Column 5, line 40, "seem" should be --sccm--

Signed and Sealed this

Fifth Day of June, 2007

JON W. DUDAS
*Director of the United States Patent and Trademark Office*